United States Patent
Lee

(10) Patent No.: US 7,203,895 B2
(45) Date of Patent: Apr. 10, 2007

(54) ERROR CORRECTION DECODING METHOD AND APPARATUS

(75) Inventor: Jun Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 446 days.

(21) Appl. No.: 10/886,663

(22) Filed: Jul. 9, 2004

(65) Prior Publication Data
US 2005/0022095 A1    Jan. 27, 2005

(30) Foreign Application Priority Data
Jul. 10, 2003    (KR) ...................... 10-2003-0046876

(51) Int. Cl.
*H03M 13/00* (2006.01)
(52) U.S. Cl. ...................... 714/780; 714/769
(58) Field of Classification Search ................ 714/780, 714/769
See application file for complete search history.

(56) References Cited

U.S. PATENT DOCUMENTS

| | | | |
|---|---|---|---|
| 5,365,231 A * | 11/1994 | Niimura ...................... 341/58 |
| 5,699,061 A * | 12/1997 | Shimpuku ...................... 341/59 |
| 6,079,041 A * | 6/2000 | Kunisa et al. ............... 714/752 |
| 6,108,811 A | 8/2000 | Nakamura et al. |
| 6,340,938 B1 * | 1/2002 | Nakagawa ...................... 341/58 |
| 6,445,313 B2 * | 9/2002 | Ahn ............................ 341/59 |
| 6,920,599 B2 * | 7/2005 | Kuwamura .................. 714/769 |
| 6,996,764 B2 * | 2/2006 | Yamada ...................... 714/755 |
| 2002/0010888 A1 | 1/2002 | Kwon |

FOREIGN PATENT DOCUMENTS
EP    0 592 229 A2    4/1994

OTHER PUBLICATIONS

Tehranchi et al., "Reliability Estimates for Data Recovered From Compact Discs" Optical Society of America, Applied Optics, 'Online!, vol. 37, No. 2, Jan. 1998, XP002295290.

(Continued)

*Primary Examiner*—Joseph D. Torres
(74) *Attorney, Agent, or Firm*—Sughrue Mion, PLLC

(57) ABSTRACT

An error correction decoding method and apparatus are provided. The error correction decoding method involves (a) outputting data corresponding to input codewords by referring to a lookup table, which stores data of a predetermined size and corresponding codewords; (b) outputting predetermined error values if there are no matches for the input codewords in the lookup table; (c) forming an error correction block by arraying the data output in step (a) or the error values output in step (b); and (d) performing an error correction decoding process, without allowing codes constituting the error correction block to exchange erasure information with one another, by referring to locations of the error values in the error correction block and the number of errors in the error correction block.

26 Claims, 8 Drawing Sheets

OTHER PUBLICATIONS

Bob: "C1 Error Detection in Circ", Internet Article, 'Online!, Dec. 5, 2002, XP002295291.

Seguin G E et al: "A Triple Error-Correcting Product Code for BYTE-Oriented Information Systems", Proceedings of the IEEE, IEEE, New York, US, vol. 73, No. 11, Nov. 1, 1985, pp. 1683-1684, XP000756017.

Adde P et al: "Design and Performance of a Product Code Turbo Encoding-Decoding Prototype", Annales des Telecommunications-Annals of Telecommunications, Presses Polytechniques et Universitaires Romandes, Luasanne, CH, vol. 54,No. ¾, Mar. 1999, pp. 214-219, XP000834643.

P. Sweeny, et al, "A Multidimensional Block Coding Scheme With Iterative Decoding", Turbo Codes in Digital Broadcasting—Could it Double Capacity, Nov. 22, 1999, pp. 15/1-15/6, XP002295292.

Yi C et al: "Interleaving and Decoding Scheme for a Product Code for a Mobile Data Communication" IEEE Transactions on Communications, IEEE, Inc. New York, US, vol. 45, No. 2, Feb. 1, 1997, pp. 144-147, XP000694661.

* cited by examiner

FIG. 1 (PRIOR ART)

| | 172 BYTES | | | | PI 10 BYTES | |
|---|---|---|---|---|---|---|
| $B_{0,0}$ | $B_{0,1}$ | $B_{0,170}$ | $B_{0,171}$ | $B_{0,172}$ | ~ | $B_{0,181}$ |
| $B_{1,0}$ | $B_{1,1}$ | $B_{1,170}$ | $B_{1,171}$ | $B_{1,172}$ | ~ | $B_{1,181}$ |
| $B_{2,0}$ | $B_{2,1}$ | $B_{2,170}$ | $B_{2,171}$ | $B_{2,172}$ | ~ | $B_{2,181}$ |
| $B_{189,0}$ | $B_{189,1}$ | $B_{189,170}$ | $B_{189,171}$ | $B_{189,172}$ | ~ | $B_{189,181}$ |
| $B_{190,0}$ | $B_{190,1}$ | $B_{190,170}$ | $B_{190,171}$ | $B_{190,172}$ | ~ | $B_{190,181}$ |
| $B_{191,0}$ | $B_{191,1}$ | $B_{191,170}$ | $B_{191,171}$ | $B_{191,172}$ | ~ | $B_{191,181}$ |
| $B_{192,0}$ | $B_{192,1}$ | $B_{192,170}$ | $B_{192,171}$ | $B_{192,172}$ | ~ | $B_{192,181}$ |
| $B_{207,0}$ | $B_{207,1}$ | $B_{207,170}$ | $B_{207,171}$ | $B_{207,172}$ | ~ | $B_{207,181}$ |

192 LINES (top), PO 16 LINES (bottom)

FIG. 2A (PRIOR ART)

| | 172 BYTES | | | | PI 10 BYTES | |
|---|---|---|---|---|---|---|
| X | X | X | X | X | ~ | X |
| $B_{1,0}$ | $B_{1,1}$ | $B_{1,170}$ | $B_{1,171}$ | $B_{1,172}$ | ~ | $B_{1,181}$ |
| $B_{2,0}$ | $B_{2,1}$ | $B_{2,170}$ | $B_{2,171}$ | $B_{2,172}$ | ~ | $B_{2,181}$ |
| $B_{189,0}$ | $B_{189,1}$ | $B_{189,170}$ | $B_{189,171}$ | $B_{189,172}$ | ~ | $B_{189,181}$ |
| $B_{190,0}$ | $B_{190,1}$ | $B_{190,170}$ | $B_{190,171}$ | $B_{190,172}$ | ~ | $B_{190,181}$ |
| $B_{191,0}$ | $B_{191,1}$ | $B_{191,170}$ | $B_{191,171}$ | $B_{191,172}$ | ~ | $B_{191,181}$ |
| $B_{192,0}$ | $B_{192,1}$ | $B_{192,170}$ | $B_{192,171}$ | $B_{192,172}$ | ~ | $B_{192,181}$ |
| $B_{207,0}$ | $B_{207,1}$ | $B_{207,170}$ | $B_{207,171}$ | $B_{207,172}$ | ~ | $B_{207,181}$ |

192 LINES (top), PO 16 LINES (bottom)

ERROR CORRECTION DECODING METHOD AND APPARATUS

BACKGROUND OF THE INVENTION

This application claims the priority of Korean Patent Application No. 2003-46876, filed on Jul. 10, 2003, in the Korean Intellectual Property Office, the disclosure of which is incorporated herein in its entirety by reference.

1. Field of the Invention

Apparatuses and methods consistent with the present invention relate to error correction decoding, and more particularly, to an error correction decoding method and apparatus, which correct errors included in information data by using error declaration information obtained as a result of decoding the data using a lookup table.

2. Description of the Related Art

In general, an error correction code for a high-density recording system, which is similar to a product code, is constituted by two error correction codes, i.e., an inner code and an outer code. The inner code indicates a horizontal code ($N_1$, $K_1$) in a data block for error correction, and the outer code indicates a vertical code ($N_2$, $K_2$) in the data block. Here, $N_i$ represents the length of an i-th codeword, i.e., an output of an error correction encoder, $K_i$ represents the length of i-th information data, i.e., an input of the error correction encoder, and t represents error correction capability of the error correction code and is obtained by the following equation: $t=(N_i-K_i)/2$. The product code can be accurate up to 2t erroneous bytes by performing error correction while allowing the inner code and the outer code to exchange erasure information with each other. More specifically, a decoder (not shown) performs a typical decoding process on the inner code (or the outer code) for as many times as the size of a column (or a line) of the inner code (or the outer code) and generates erasure information to be provided to the outer code (or the inner code), i.e., error declaration information that indicates where errors have occurred in a codeword to be decoded. Here, the reason the decoder performs the typical decoding process, rather than an erasure decoding process which guarantees better error correction performance, on the inner code (or the outer code) is that the decoder may not receive the erasure information from the outside. The decoder performs the typical decoding process on the outer code (or the inner code) for as many times as the size of a column (or a line) of the outer code (or the inner code) by using the erasure information received from the inner code (or the outer code) and generates erasure information to be provided to the inner code (or the outer code). Supposing that all of the above decoding processes constitutes one cycle, the decoder performs a predetermined number of cycles of decoding on the inner code and the outer code. If more than a maximum number of errors that can be handled by the inner code (or the outer code) have occurred in the codeword to be decoded, erasure of as many errors as the size of the column of the inner code (or the outer code) is declared. A recording system usually uses a Reed-Solomon code as an error correction code because the Reed-Solomon code has excellent burst error correction capability. Here, burst errors are the most common errors occurring in a recording system.

Erasure information is very important for the Reed-Solomon code because the decoding performance of the Reed-Solomon code can be maximized by simply providing accurate erasure information. However, in a conventional erasure declaring method, erasure of code symbols can be declared even though the code symbols are not erroneous. In other words, in the prior art, a decoding process is performed while allowing an inner code and an outer code of the Reed-Solomon code to exchange inaccurate erasure information with each other, which results in a deterioration in error correction performance of the Reed-Solomon code.

FIG. 1 illustrates a structure of a Reed-Solomon product code (RS-PC), which is a conventional error correction code. Referring to FIG. 1, the RS-PC is comprised of a horizontal code (182, 179) and a vertical code (208, 192). The horizontal code (182, 179), which is referred to as an inner code, can correct 5 to a maximum of 10 erroneous bytes in an erasure decoding process. The vertical code (208, 192), which is referred to as an outer code, can correct 8 erroneous bytes. In the erasure decoding process, the outer code can correct up to 16 erroneous bytes. An RS-PC decoding process is performed in the following manner. Erasure information to be provided to the outer code is generated by performing a decoding process on each row of the inner code 208 times. Thereafter, erasure information to be provided to the inner code is generated by performing an erasure decoding on each column of the outer code 172 times with the use of the erasure information provided when decoding the inner code. Supposing that all of the above decoding processes constitutes one cycle, a predetermined number of cycles of decoding can be performed.

FIGS. 2A and 2B illustrate examples of erasure declarations issued in the RS-PC structure of FIG. 1. More specifically, FIG. 2A illustrates an occasion where six errors have occurred in a first row of the inner code of the RS-PC structure when decoding the RS-PC structure. In FIG. 2A, X indicates the location of each error occurring in the RS-PC structure. If six errors have occurred in the first row of the inner code of the RS-PC structure, a decoder issues a declaration of erasure of the first row of the inner code. In other words, the decoder issues a declaration that all bytes in the first row of the inner code are erroneous, which is inaccurate and then transfers inaccurate error information to the outer code.

FIG. 2B illustrates an occasion where a total of 16 errors have occurred in first three columns of the RS-PC structure in a horizontal direction and a total of 17 errors have occurred in fourth through tenth columns of the RS-PC structure in the horizontal direction. In FIG. 2B, X indicates the location of each error occurring in the RS-PC structure. The decoder generates 17 pieces of erasure information when decoding the inner code of the RS-PC structure and then transfers the 17 pieces of erasure information to the outer code. Since the outer code can only correct up to 16 erroneous bytes, the errors in the first three columns of the RS-PC structure, which could have been successfully corrected if the decoder had been provided accurate erasure information, cannot be corrected. In other words, even errors that fall into an error correction range may not be corrected because of inaccurate erasure information.

FIG. 3 illustrates another structure of a conventional error correction code, i.e., a picket code. Referring to FIG. 3, the picket code extends in a vertical direction and is comprised of a sync code 30, a plurality of long distance codes 31, and a plurality of burst indicator codes 32. Each of the long distance codes 31 and the burst indicator codes 32 is formed based on an RS code. More specifically, each of the burst indicator codes 32 is formed based on RS(62, 30) so as to be able to accurate 16 to a maximum of 32 erroneous bytes in an erasure decoding process. Each of the long distance codes 31 is formed based on RS(248, 216) so as to be able to accurate 16 to a maximum of 32 erroneous bytes in the erasure decoding process. Each of the long distance codes 31 is comprised of information data and parity data, and each of the burst indicator codes 32 is comprised of sector data, control data, and parity data. A method of issuing an erasure declaration in the picket code is as follows. If errors have occurred in the same line of the sync code 30 and a burst indicator code 32, or if errors have occurred in the same line of two different burst indicator codes 32, it is declared that all bytes in the corresponding line are erroneous. Thereafter, an erasure decoding process is performed on each of the long distance codes 31 according to erasure information obtained as a result of the declaration. However, if the erasure information is inaccurate, error correction efficiency may be decreased.

FIG. 4A illustrates an error correction failure that has occurred in a picket code. More specifically, FIG. 4A illustrates an occasion when errors have occurred in the same rows of burst indicator codes 40 and 41 and the number of error lines of each of the burst indicator codes 40 and 41 exceeds 16, a decoder (not shown) declares an error correction failure for the burst indicator codes 40 and 41 and fails to provide any erasure information to a long distance code 42. Therefore, the decoder also declares error correction failure for the long distance code 42, thus decreasing error correction efficiency.

FIG. 4B illustrates an example of an error correction failure that has occurred in a picket code. More specifically, FIG. 4B illustrates an occasion where 32 lines of errors have sporadically occurred in the vicinity of two burst indicator codes 43 and 44 and less than 16 errors have occurred in a long distance code 45. If a decoder (not shown) decodes the long distance code 45 without using pieces of erasure information provided for the burst indicator codes 43 and 44, all the errors, which are less than 16, can be corrected. However, in principle, the picket code is decoded by decoding the long distance code 45 using the pieces of erasure information provided for the burst indicator codes 43 and 44. Therefore, if the number of pieces of the erasure information provided for the burst indicator codes 43 and 44, i.e., detected error information, and the number of errors yet to be detected exceed a maximum number of bytes that can be corrected in the long distance code 45, i.e., 32, the decoder declares an error correction failure.

In short, a deterioration in the performance of a picket code is mainly due to inaccurate erasure information provided to a long distance code by a burst indicator code.

Accordingly, it is necessary to provide accurate erasure information for an RS-PC or a picket code.

SUMMARY OF THE INVENTION

The present invention provides an error correction decoding method and apparatus, which take advantage of error declaration information, obtained as a result of modulation-decoding data by referring to a lookup table used in a recording system, as erasure information for error correction decoding.

According to an exemplary embodiment of the present invention, there is provided an error correction decoding method. The error correction decoding method involves (a) outputting data corresponding to input codewords by referring to a lookup table, which stores data of a predetermined size and corresponding codewords; (b) outputting predetermined error values if there are no matches for the input codewords in the lookup table; (c) forming an error correction block by arraying the data output in step (a) or the error values output in step (b); and (d) performing an error correction decoding process, without allowing codes constituting the error correction block to exchange erasure information with one another, by referring to locations of the error values in the error correction block and the number of errors in the error correction block.

According to another exemplary embodiment of the present invention, there is provided an error correction decoding apparatus. The error correction decoding apparatus includes a lookup table, which stores codewords for data of a predetermined size; a first decoder, which outputs data corresponding to input codewords by referring to the lookup table and outputs predetermined error values if there are no matches for the input codewords in the lookup table; and a second decoder, which forms an error correction block using the data or the error values output from the first decoder and performs an error correction decoding process, without allowing codes constituting the error correction block to exchange erasure information with one another, by referring to locations of the error values and the number of errors in the error correction block.

BRIEF DESCRIPTION OF THE DRAWINGS

The above and other features and advantages of the present invention will become more apparent by describing in detail exemplary embodiments thereof with reference to the attached drawings in which:

FIG. 1 is a diagram illustrating the structure of a Reed-Solomon product code (RS-PC), which is a conventional error correction code;

FIGS. 2A and 2B are diagrams illustrating examples of erasure declarations issued in the RS-PC of FIG. 1;

DETAILED DESCRIPTION OF ILLUSTRATIVE, NON-LIMITING EMBODIMENTS OF THE INVENTION

The present invention will now be described more fully with reference to the accompanying drawings, in which exemplary embodiments of the invention are shown.

Figure 2B:
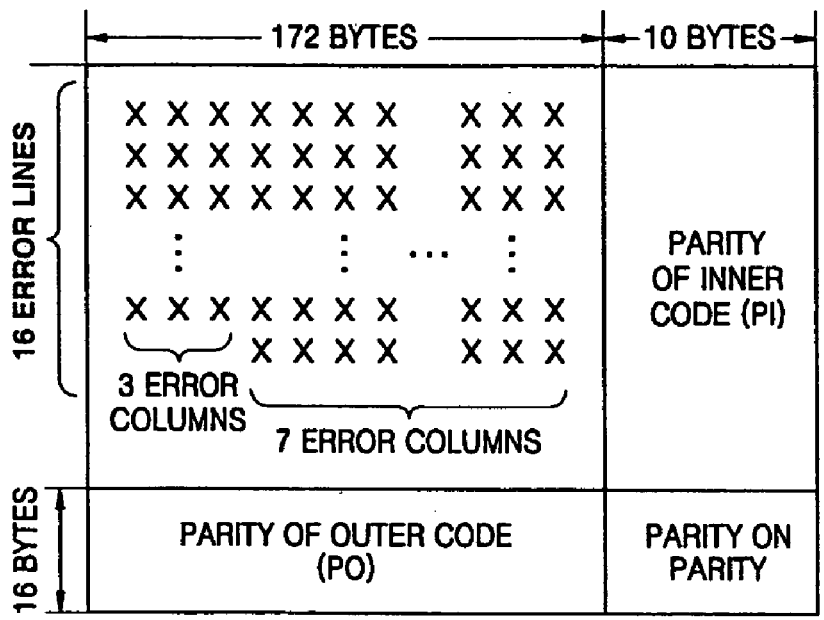
Figure 3:
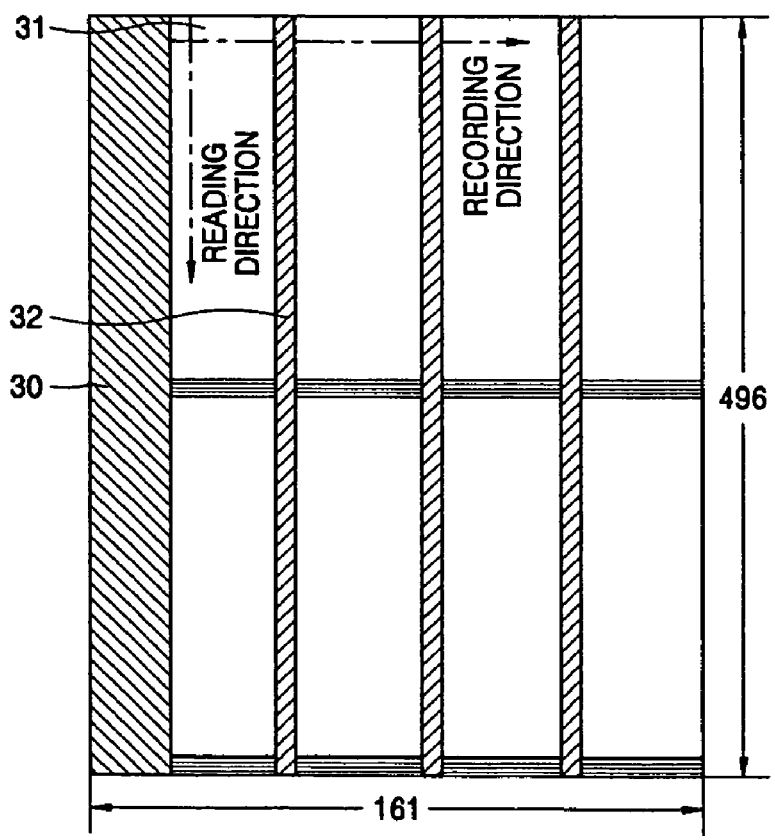
FIG. 3 is a diagram illustrating the structure of a picket code, which is another conventional error correction code.
Figure 4A:
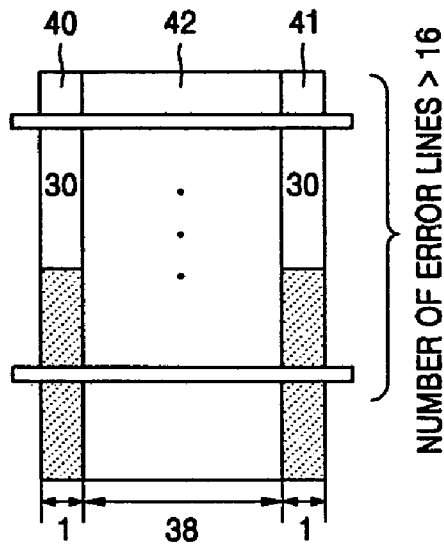
FIG. 4A is a diagram illustrating an example of an error correction failure that has occurred in a picket code.
Figure 4B:
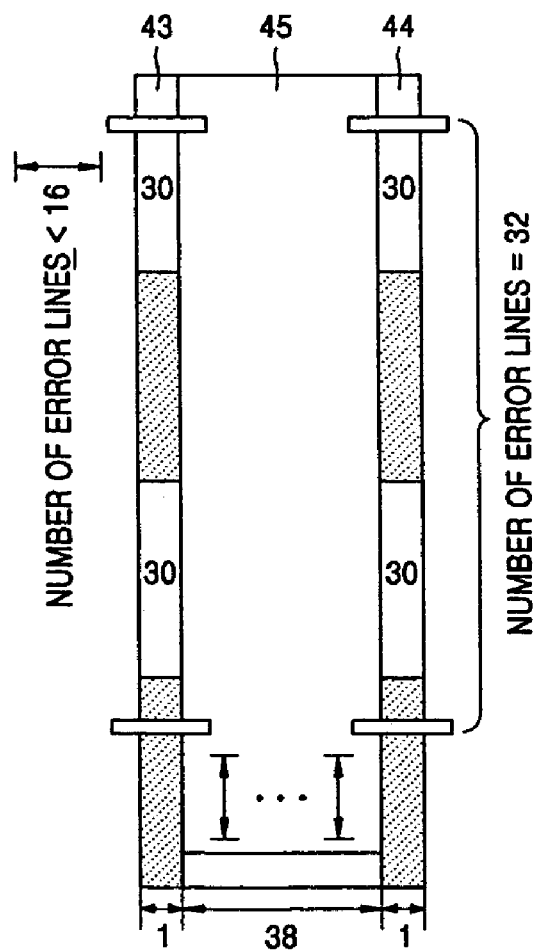
FIG. 4B is a diagram illustrating an example of an error correction failure that has occurred in a picket code.
Figure 5:
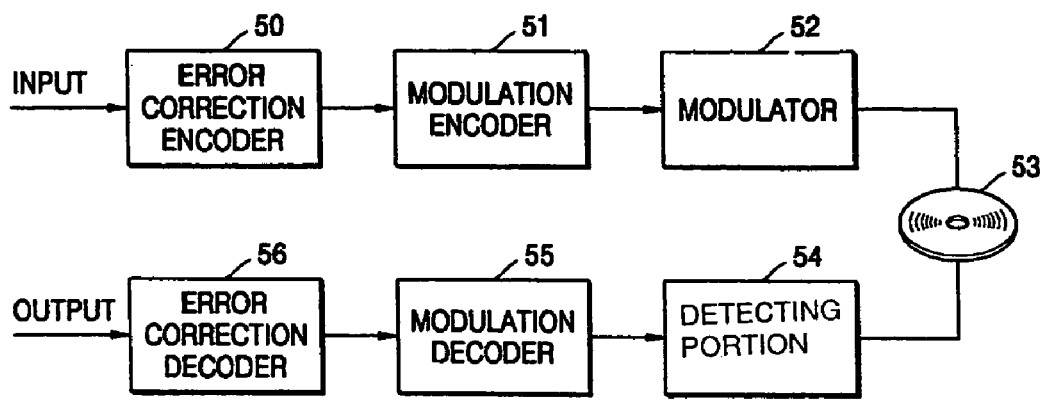
FIG. 5 is a block diagram illustrating a recording system, to which the present invention is applied.

FIG. 5 is a block diagram illustrating a recording system, to which an exemplary embodiment of the present invention is applied. Referring to FIG. 5, the recording system includes an error correction encoder 50, a modulation encoder 51, a modulator 52, a recording medium 53, a detector 54, a modulation decoder 55, and an error correction decoder 56.

The error correction encoder 50 encodes an input signal using at least one error correction code having a one-dimensional or two-dimensional structure. The error correction code may be a linear block code, such as a product code, (e.g., a Reed-Solomon code) or a picket code.

The modulation encoder 51 encodes the encoded signal output from the error correction encoder 50, by referring to a lookup table (not shown). The modulator 52 modulates the encoded signal output from the modulation encoder 51 using a non-return to zero (NRZ) or non-return to zero inverted (NRZI) modulation method so that the modulated signal can be recorded on the recording medium 53.

The detector 54 equalizes a signal read from the recording medium 53, detects a level of the equalized signal, and demodulates the detected level into data.

The modulation decoder 55 decodes the demodulated data output from the detector 54 by inversely referring to the lookup table, which has been referred to by the modulation encoder 51. If an error occurs in the process of decoding the demodulated data, the modulation decoder 55 informs the error correction decoder 56 of such occurrence. If the lookup table does not have a perfect match for a codeword input to the demodulation decoder 55, the modulation decoder 55 outputs a predetermined initial value, which is different from other values corresponding to various decoding results, so as to indicate that an error has occurred. The predetermined initial value, which is an arbitrary value set by a manufacturer, is set to E, which indicates that there is no match for the predetermined initial value in an error correction code format.

The error correction decoder 56 can form an error correction block by using error information provided by the modulation decoder 55 and the decoded data output from the modulation decoder 55. Thereafter, the error correction decoder 56 may perform an error correction decoding process on the error correction block several times. The error correction block is comprised of at least one error correction code having a one-dimensional or two-dimensional array structure.

Figure 6:
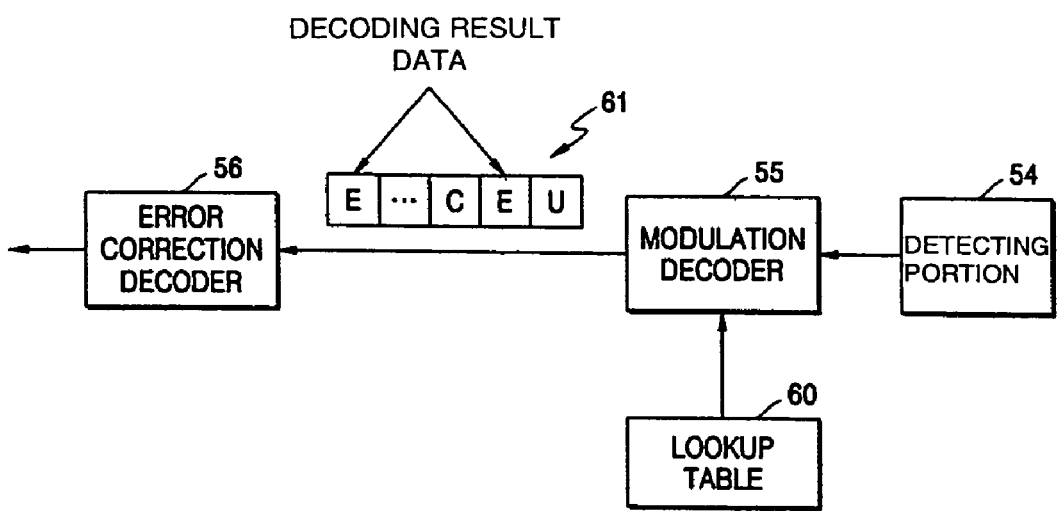
FIG. 6 is a block diagram illustrating an error correction decoding apparatus, according to an exemplary embodiment of the present invention.

FIG. 6 is a block diagram illustrating an error correction decoding apparatus according to an exemplary embodiment of the present invention. More specifically, FIG. 6 illustrates a provision of error information by the modulation decoder 55. Referring to FIG. 6, the modulation decoder 55 compares data received from the detector 54 with data in a lookup table 60 and outputs a decoding result data 61, which matches the received data searched in the lookup table 60, to the error correction decoder 56.

If the lookup table 60 has a match for the received data, the modulation decoder 55 outputs accurate data C or undetectable error data U depending on whether the received data has an error. If the received data does not have any errors, the modulation decoder 55 outputs the accurate data C. Otherwise, the modulation decoder 55 outputs a certain value corresponding to the received data having an error, i.e., the undetectable error data U. If there is no match for the received data in the lookup table 60, the modulation decoder 55 outputs erasure information E, which indicates that the received data has an error. Here, it may be desired to set E to a predetermined value that does not exist in the lookup table 60 in advance in order to distinguish E from C (or U).

The error correction performance of the error correction decoder 56 depends on the number of errors U that have not been detected because the error correction capability of, for example, an RS code satisfies the following inequality: $T \geq 2U+E$ where T represent a maximum number of bytes that can be corrected by the RS code. In the present embodiment, unlike in the prior art, the error correction decoder 56 takes advantage of erasure information provided by the modulation decoder 55, instead of generating the erasure information in a decoding process. Accordingly, it is possible to increase error correction efficiency by preventing two error correction codes constituting an error correction block from exchanging inaccurate erasure information with each other.

An error correction decoding process performed by the error correction decoder 56 will be described more fully in the following paragraphs.

A value representing error information that has been generated in a modulation decoding process, i.e., an initial value, is set to a predetermined value that does not exist in a finite field $GF(2^n)$. Thereafter, a 1D or 2D array error correction block is formed by using a result of the modulation decoding process.

If an error correction code constituting the error correction block is a product code including an RS code, the error correction decoder 56 decodes data simply using erasure information provided by the modulation decoder 55 and without allowing an inner code and an outer code to exchange erasure information with each other. If an error correction failure is declared for the inner code (or the outer code) during this decoding process, in other words, if the number of errors occurring in a codeword exceeds an error correction capability of the inner code (or the outer code), errors in a block currently being decoded are not corrected. Instead, only the remaining data, which is error-stricken, is decoded. Thereafter, the error correction process is performed on the outer code (or the inner code). In other words, in the present embodiment, error correction codes are set to have different error correction capabilities in order to enhance a code rate. For example, one of the error correction codes may have better error correction capability than the other. Therefore, if one of the error correction codes, for example, the inner code, completes an error correction process leaving some errors yet to be corrected, the other error correction code, for example, the outer code, is allowed to correct the remaining errors. The outer code decodes the data by using a result of the error correction performed by the inner code and the erasure information provided by the modulation decoder 55.

If the error correction code is a picket code, burst indicator codes and long distance codes are independently decoded using the erasure information provided by the modulation decoder 55 and without allowing a burst indicator code and a long distance code to exchange erasure information with each other. For example, an error correction decoding process is performed on the burst indicator code by using the erasure information provided by the modulation decoder 55, and then the error correction decoding process is performed on the long distance code by using the erasure information provided by the modulation decoder 55. If an error correction failure is declared for the burst indicator code or the long distance code during these decoding processes, in other words, if the number of errors occurring in a codeword exceeds an error correction capacity of the burst indicator code (or the long distance code), the errors in the block currently being decoded are not corrected. Instead, the remaining errors of the data are corrected. All this decoding can be repeatedly performed on the error correction code, thus achieving better error correction performance.

In the present exemplary embodiment, unlike in the prior art, even if an error correction failure is declared for a block currently being decoded, erasure information indicating that the entire block is erroneous is not generated, and the block is kept intact.

FIGS. 7A through 10B are diagrams for illustrating the error correction performance of the present invention with the error correction performance of the prior art.

Figure 7B:
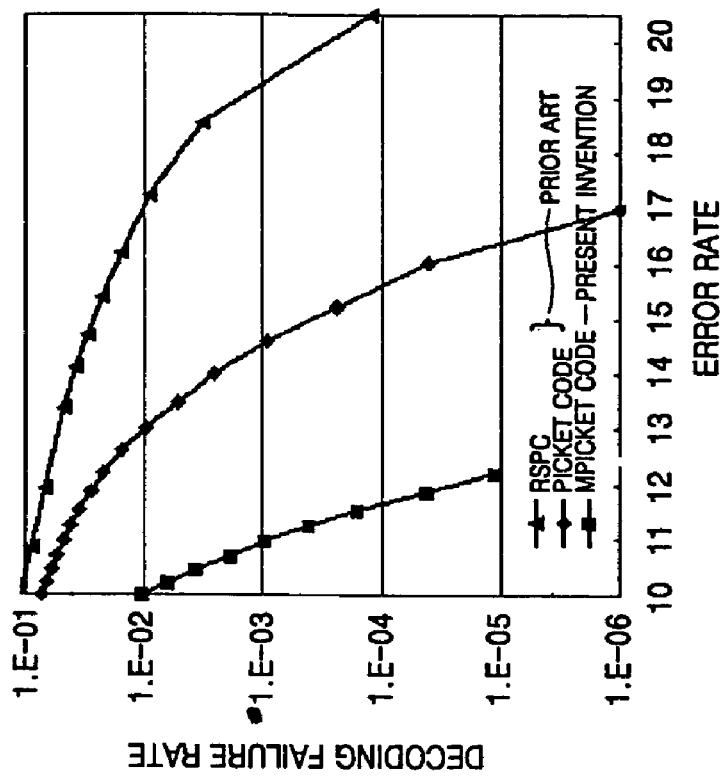
FIG. 7B is a diagram for comparing the error correction performance of an exemplary embodiment of the present invention when applied to a picket code with the error correction performance of the prior art in a case where a random error exists in both an RS-PC and a picket code.
Figure 7A:
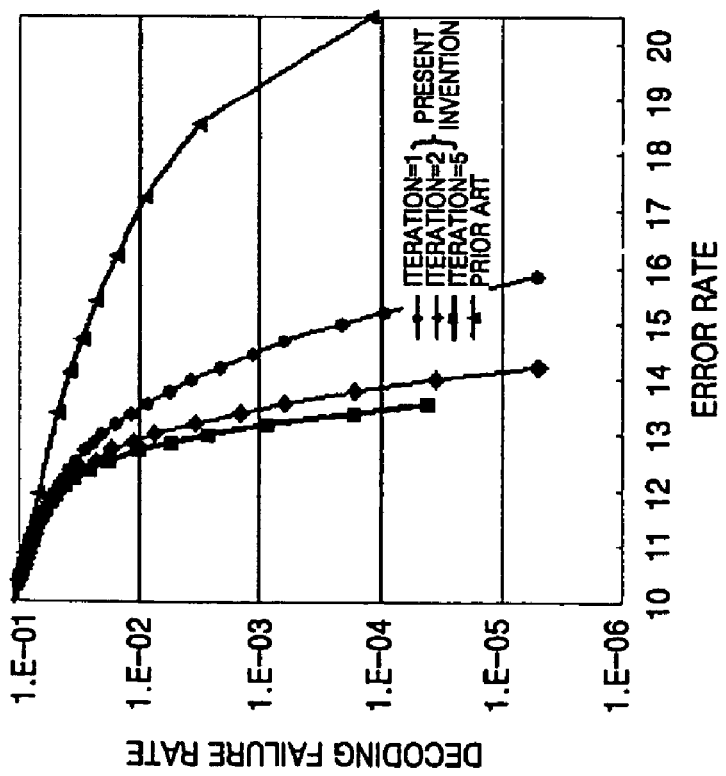
FIG. 7A is a diagram for comparing the error correction performance of an exemplary embodiment of the present invention with the error correction performance of the prior art in a case where random errors exist in an RS-PC.

More specifically, FIG. 7A is a diagram for comparing the error correction performance of an exemplary embodiment of the present invention with the error correction performance of the prior art in a case where random errors exist in an RS-PC, and FIG. 7B is a diagram for comparing the error correction performance of the present invention when applying the present invention to a picket code with the error correction performance of the prior art in a case where the random errors exist in both the RS-PC and the picket code.

Figure 8B:
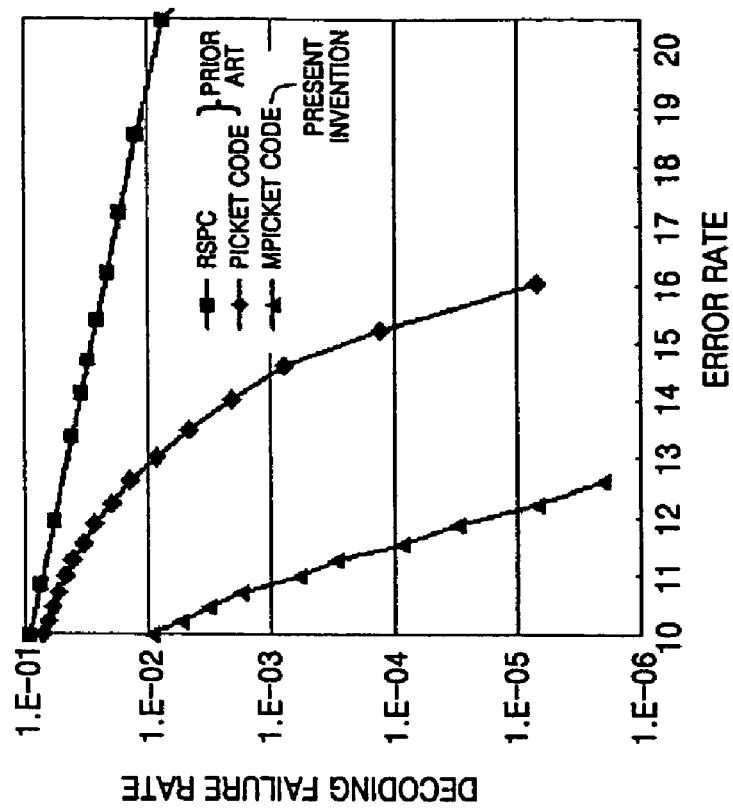
FIG. 8B is a diagram for comparing the error correction performance of an exemplary embodiment of the present invention applied to a picket code with the error correction performance of the prior art in a case where a short random error exists in both an RS-PC and the picket code.
Figure 8A:
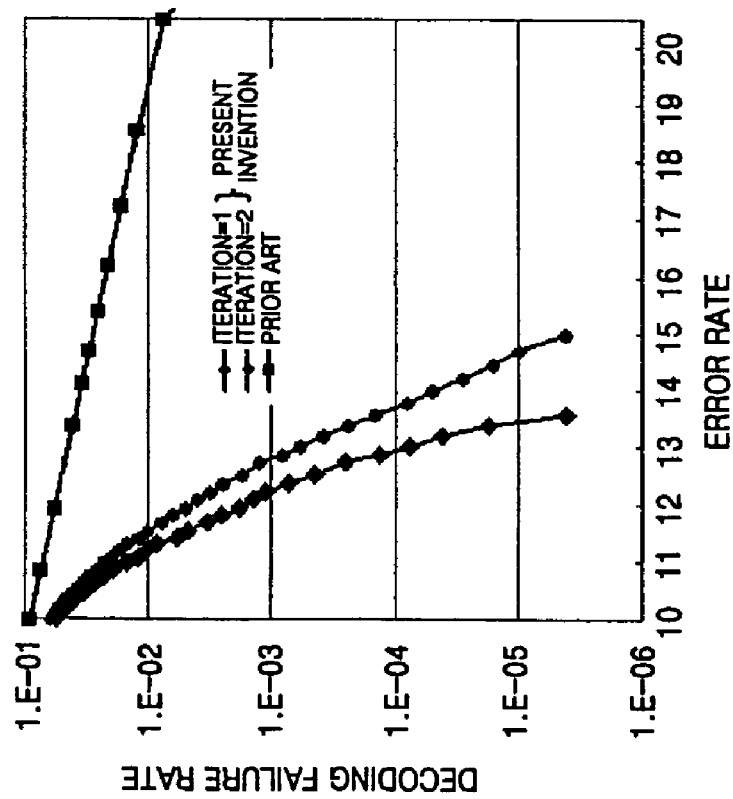
FIG. 8A is a diagram for comparing the error correction performance of an exemplary embodiment of the present invention with the error correction performance of the prior art in a case where a short random error exists in an RS-PC.

FIG. 8A is a diagram for comparing the error correction performance of an exemplary embodiment of the present invention with the error correction performance of the prior art in a case where short random errors exist in an RS-PC, and FIG. 8B is a diagram for comparing the error correction performance of an exemplary embodiment of the present invention when applying the present invention to a picket code with the error correction performance of the prior art in a case where the short random errors exist in both the RS-PC and the picket code. Here, the short random errors are errors with a predetermined number of bytes determined by a user. In the present embodiment, an error of 5–20 bytes is referred to as the short random error.

Figure 9B:
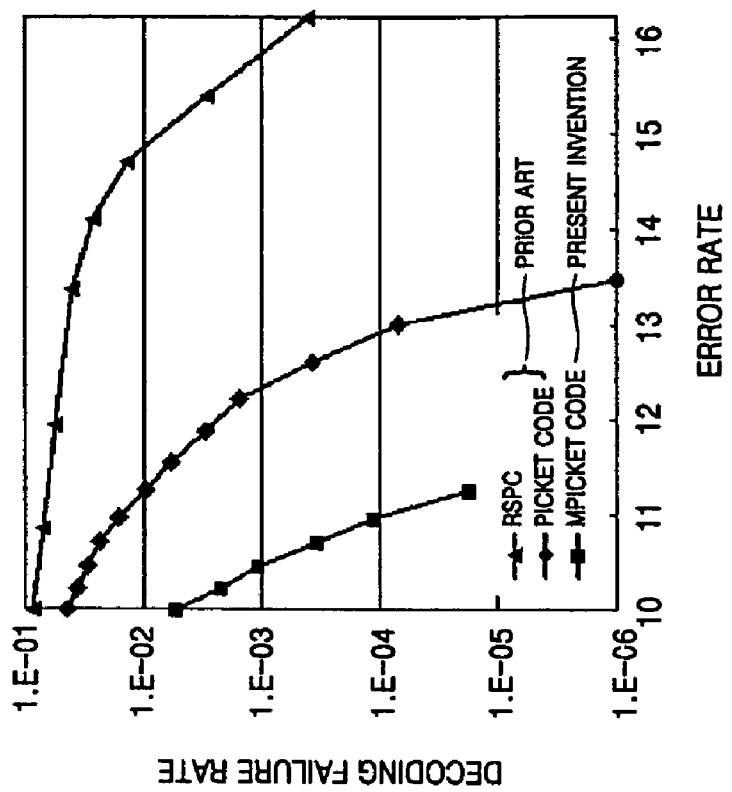
FIG. 9B is a diagram for comparing error correction performance of an exemplary embodiment of the present invention applied to a picket code with error correction performance of the prior art in a case where a long random error exists in both an RS-PC and the picket code.
Figure 9A:
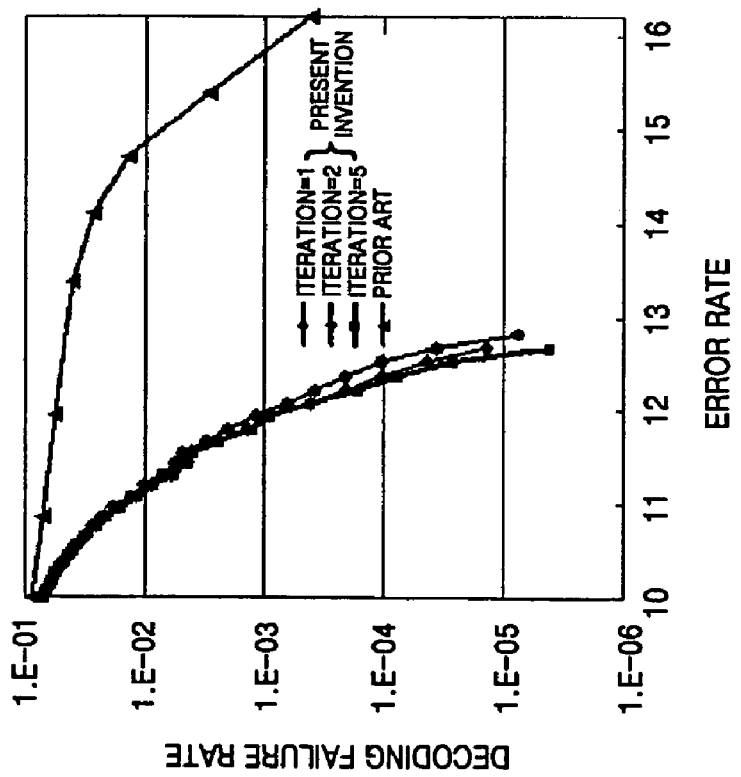
FIG. 9A is a diagram for comparing error correction performance of an exemplary embodiment of the present invention with error correction performance of the prior art in a case where a long random error exists in an RS-PC.

FIG. 9A is a diagram for comparing error correction performance of an exemplary embodiment of the present invention with error correction performance of the prior art in a case where long random errors exist in an RS-PC, and FIG. 9B is a diagram for comparing error correction performance of the present invention when applying the present invention to a picket code with error correction performance of the prior art in a case where the long random errors exist in both the RS-PC and the picket code. Here, the long random error indicates an error with more bytes than those of the short random error. In the present embodiment, an error of 40–180 bytes is referred to as the long random error.

Figure 10A:
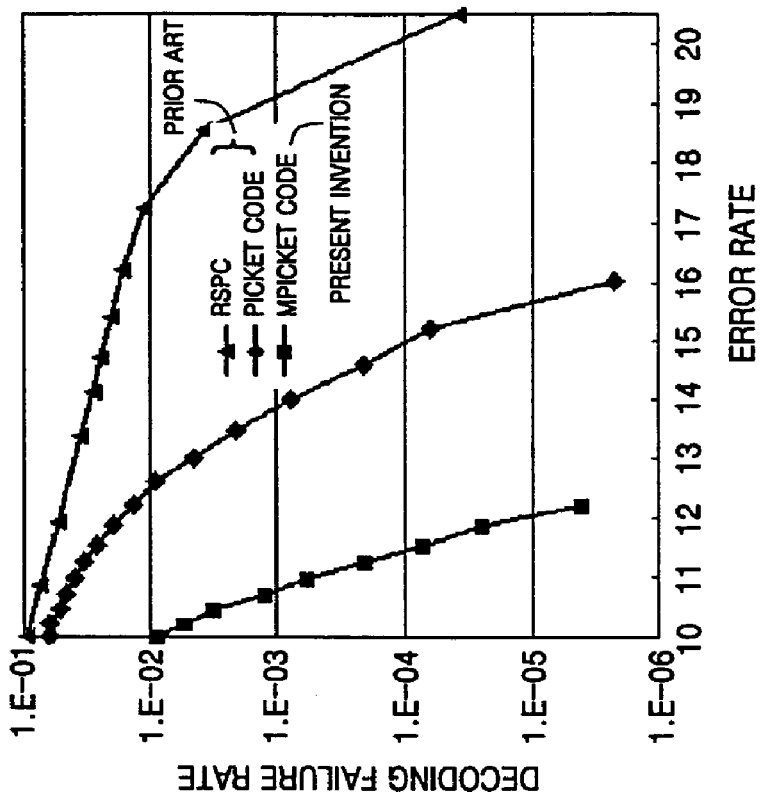
FIG. 10A is a diagram for comparing error correction performance of an exemplary embodiment of the present invention with error correction performance of the prior art in a case where random errors, short random errors, and long random errors exist in an RS-PC at equal proportions.
Figure 10B:
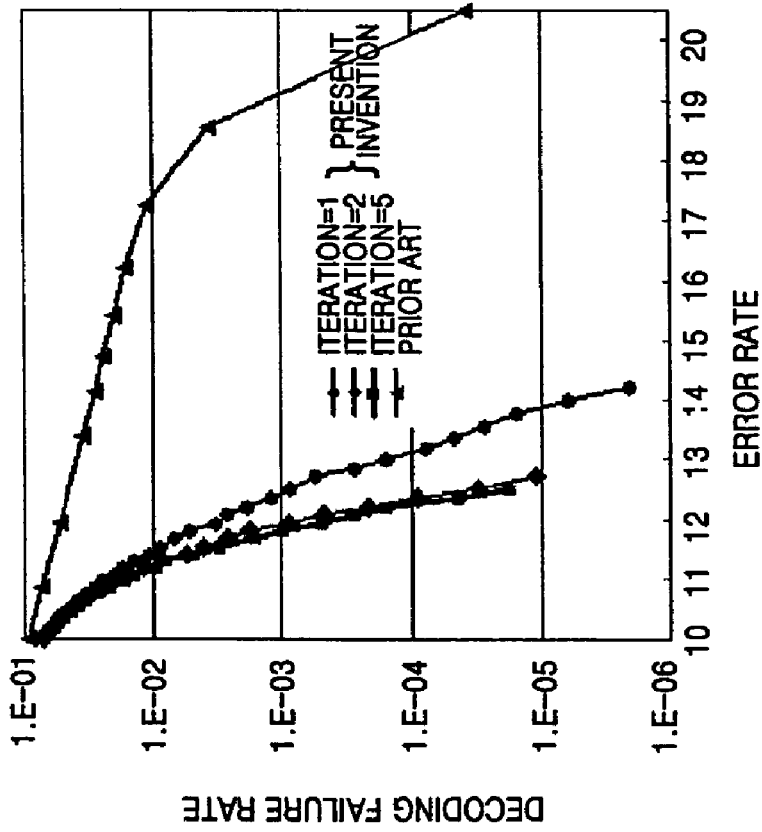
FIG. 10B is a diagram for comparing error correction performance of an exemplary embodiment of the present invention applied to a picket code with error correction performance of the prior art in a case where a random error, a short random error, and a long random error exist in both an RS-PC and the picket code.

FIG. 10A is a diagram for comparing error correction performance of the present invention with error correction performance of the prior art in a case where random errors, short random errors, and long random errors exist in an RS-PC at equal proportions, and FIG. 10B is a diagram for comparing error correction performance of the present invention when applying the present invention to a picket code with error correction performance of the prior art in a case where the random error, the short random error, and the long random error exist in both the RS-PC and the picket code.

Referring to FIGS. 7A, 8A, 9A, and 10A, the present invention is superior to the prior art in terms of error correction performance. In particular, error correction efficiency can be enhanced by repeatedly performing the error correction method of the present invention.

Referring to FIGS. 7B, 8B, 9B, and 10B, the error correction performance of the prior art when using an RS-PC is better when applying the prior art to a picket code than when applying the prior art to an RS-PC code, and the error correction performance of the present invention is generally superior to the error correction performance of the prior art.

According to the present invention, better error correction performance than that of the prior art can be guaranteed without considerably modifying a conventional error correction algorithm, by simply using error information output from a modulation decoder as erasure information in an error correction decoding process.

What is claimed is:

1. An error correction decoding method, comprising:
    (a) outputting data corresponding to input codewords by referring to a lookup table, which stores data and corresponding codewords;
    (b) outputting predetermined error values if there are no matches for the input codewords in the lookup table;
    (c) forming an error correction block by arraying the data output in step (a) or the error values output in step (b); and
    (d) performing an error correction decoding process, without allowing codes constituting the error correction block to exchange erasure information with one another, by referring to locations of the error values in the error correction block and a number of errors in the error correction block.

2. The error correction decoding method of claim 1, wherein the error correction block comprises at least one error correction code having a one-dimensional or two-dimensional array structure.

3. The error correction decoding method of claim 2, wherein the error correction codes are linear block codes.

4. The error correction decoding method of claim 3, wherein step (d) comprises:
    (d1) error correction decoding a first code, selected among the codes constituting the error correction block, by referring to the locations of the error values and the number of errors in the error correction block; and
    (d2) error correction decoding a second code, which has not been selected among the codes constituting the error correction block, by referring to the locations of the error values, the number of errors in the error correction block, and a result of the error correction decoding performed in step (d1).

5. The error correction decoding method of claim 4, wherein in step (d1), if the number of errors is beyond an error correction capability of the first code, remaining non-erroneous data in the first code is decoded without correcting the errors in the error correction block.

6. The error correction decoding method of claim 4, wherein in step (d2), if the result of the error correction decoding process performed in step (d1) shows that the number of errors in the second code is beyond an error correction capability of the second code, remaining non-erroneous data in the second code is decoded without correcting the errors.

7. The error correction decoding method of claim 4 further comprising:
repeatedly performing steps (d1) and (d2).

8. The error correction decoding method of claim 4, wherein the error correction block comprises a product code.

9. The error correction decoding method of claim 8, wherein the product code is a Reed-Solomon product code.

10. The error correction decoding method of claim 3, wherein step (d) comprises:
(d1) error correction decoding a first code, which is selected among the codes constituting the error correction block, by referring to the locations of the error values and the number of errors in the error correction block; and
(d2) error correction decoding a second code, which has not been selected among the codes constituting the error correction block, by referring to the locations of the error values and the number of errors in the error correction block.

11. The error correction decoding method of claim 10, wherein in step (d1), if the number of errors in the error correction block is beyond the error correction capability of the first code, remaining non-erroneous data in the first code is decoded without correcting the errors.

12. The error correction decoding method of claim 10, wherein in step (d2), if the number of errors is beyond the error correction capability of the second code, remaining non-erroneous data in the second code is decoded without correcting the errors.

13. The error correction decoding method of claim 10 further comprising:
repeatedly performing steps (d1) and (d2).

14. The error correction decoding method of claim 10, wherein the error correction block comprises a picket code.

15. An error correction decoding apparatus, comprising:
a lookup table, which stores codewords for data;
a first decoder, which outputs data corresponding to input codewords by referring to the lookup table and outputs predetermined error values if there are no matches for the input codewords in the lookup table; and
a second decoder, which forms an error correction block using the data or the error values output from the first decoder and performs an error correction decoding process, without allowing codes of the error correction block to exchange erasure information with one another, by referring to locations of the error values and a number of errors in the error correction block.

16. The error correction decoding apparatus of claim 15, wherein the error correction block comprises at least one error correction code having a one-dimensional or two-dimensional array structure.

17. The error correction decoding apparatus of claim 16, wherein the second decoder error correction decodes a first code, which is selected among the codes constituting the error correction block, by referring to the locations of the error values and the number of errors in the error correction block and then error correction decodes a second code, which has not been selected among the codes constituting the error correction block, by referring to the locations of the error values, the number of errors in the error correction block, and a result of the error correction decoding of the first code.

18. The error correction decoding apparatus of claim 17, wherein the second decoder decodes remaining non-erroneous data in the first code without correcting the errors if a number of errors in the first code is beyond an error correction capability of the first code.

19. The error correction decoding apparatus of claim 17, wherein the second decoder decodes remaining non-erroneous data in the second code without correcting the errors if the result of the error correction decoding of the first code shows that the number of errors in the second code is beyond an error correction capability of the second code.

20. The error correction decoding apparatus of claim 17, wherein the second decoder repeatedly error correction decodes the first or second code by referring to the result of the error correction decoding of the first or second code.

21. The error correction decoding apparatus of claim 16, wherein the second decoder error correction decodes a first code, which is selected among the codes of the error correction block, by referring to the locations of the error values and the number of errors in the first code and then error correction decodes the second code, which has not been error-corrected among the codes of the error correction block.

22. The error correction decoding apparatus of claim 21, wherein the second decoder decodes remaining non-erroneous data without correcting the errors in the error correction block if the number of errors in the first code is beyond the error correction capability of the first code.

23. The error correction decoding apparatus of claim 21, wherein the second decoder decodes remaining non-erroneous data without correcting the errors if the number of errors in the second code is beyond the error correction capability of the second code.

24. The error correction decoding apparatus of claim 21, wherein the second decoder repeatedly error correction decodes the first or second code by referring to a result of the error correction decoding of the first or second code.

25. The error correction decoding method of claim 1, wherein the data stored in the lookup table is a predetermined size.

26. The error correction decoding apparatus of claim 15, wherein the data stored in the lookup table is a predetermined size.

* * * * *